United States Patent [19]

Sirito-Olivier et al.

[11] Patent Number: 5,619,160

[45] Date of Patent: Apr. 8, 1997

[54] CONTROL CIRCUIT FOR SETTING A BIAS SOURCE AT PARTIAL STAND-BY

[75] Inventors: Philippe Sirito-Olivier, Grenoble; Bernard Majoux, Meylan, both of France

[73] Assignee: SGS-Thomson Microelectronics S.A., Saint Genis Pouilly, France

[21] Appl. No.: 493,753

[22] Filed: Jun. 22, 1995

[30] Foreign Application Priority Data

Jun. 27, 1994 [FR] France .................................. 94 08120

[51] Int. Cl.⁶ ...................................................... G05F 1/10
[52] U.S. Cl. ......................... 327/530; 327/544; 323/315
[58] Field of Search ................................. 327/108, 530, 327/541, 543, 540, 542, 403, 404, 405, 544; 323/315, 312

[56] References Cited

U.S. PATENT DOCUMENTS

| 4,361,815 | 11/1982 | Schade, Jr. | 330/254 |
|---|---|---|---|
| 4,442,398 | 4/1984 | Bertails et al. | 323/315 |
| 4,496,425 | 1/1985 | McKenzie | 327/542 |
| 4,616,142 | 10/1986 | Upadhyay et al. | 327/405 |
| 4,792,750 | 12/1988 | Yan | 323/315 |
| 4,890,052 | 12/1989 | Hellums | 323/315 |
| 4,978,905 | 12/1990 | Hoff et al. | 323/314 |
| 5,404,096 | 4/1995 | Thiel | 323/312 |
| 5,440,258 | 8/1995 | Galbi et al. | 327/541 |

OTHER PUBLICATIONS

IEEE Journal of Solid–State Circuits, vol. SC–21, no. 6, Dec. 1986, New York, US, pp. 901–908 Fisher et al., "A 50–Mbit/s CMOS Optical Transmitter Integrated Circuit".

*Primary Examiner*—Timothy P. Callahan
*Assistant Examiner*—Jung Ho Kim
*Attorney, Agent, or Firm*—David M. Driscoll; James H. Morris

[57] ABSTRACT

The invention relates to a control circuit for setting a ΔVbe/R bias source at stand-by from a stand-by control signal including circuitry for virtually modifying, as a function of the state of the stand-by control signal, the emitter surface area of at least one of the matching-pair current mirror bipolar transistors in the bias source.

20 Claims, 3 Drawing Sheets

CONTROL CIRCUIT FOR SETTING A BIAS SOURCE AT PARTIAL STAND-BY

BACKGROUND OF THE INVENTION

1. Field of the Invention

The present invention relates to a control circuit for setting a ΔVbe/R bias source at partial stand-by by a stand-by control signal.

This application is related to an application entitled DEVICE FOR SETTING A BIAS SOURCE AT STAND-BY and to an application entitled BIAS SOURCE CONTROL CIRCUIT, both filed on an even date herewith, and incorporated herein by reference.

2. Discussion of the Related Art

Stand-by circuits are used to reduce power consumption in a circuit during periods of non-use by deactivating the bias source, without it being necessary to switch off the circuit. They are of particular interest for systems with an independent power supply, consisting of, for example, ordinary or rechargeable batteries, such as remote sensors. The role of such sensors is, for example, to transmit data to a control panel in the case of a change in the state of the sensor. In such devices, it is essential to limit the consumption of the sensor during periods when its state is stable. In order to do this, the bias source of its emission units is set at stand-by when the sensor is in a stable state for a predetermined time interval. This enables the consumption of the device to be reduced during these periods. The bias source is reactivated as soon as the stand-by control signal changes state, giving an indication that the sensor no longer is in a stable state.

A disadvantage of conventional stand-by circuits lies in their power consumption during their switching and during the bias source stand-by periods. In fact, for the purposes of stand-by control, in general, a logic device based on inverters is used. The role of this device is to transform the stand-by control signal into a logic signal from the viewpoint of the bias source. The current consumption of the inverter has, when switching, a peak value which is damped through the series resistors of the MOS transistors which constitute the inverter. This power consumption is therefore a function of the switching time of the stand-by control signal.

Moreover, although the stand-by signal is in general already a logic signal, often the potentials of its states do not correspond to the supply potentials of the bias source. Thereby a continuous level of residual power is consumed during the stand-by periods of the bias source. This power consumption increases as the difference between the low state of the stand-by control signal and the potential of the negative power supply terminal of the bias source increases.

In addition, in some cases, it is required that certain circuit units be activated by the bias source, while other units could be set at stand-by.

The current solution to this type of situation is to provide a distinct bias source for each unit, or group of units of the circuit that can be set at stand-by at the same time. Thus, in order to reduce the power consumption of the circuit, the number of bias sources must necessarily be increased, which increases the surface area of the chip needed to implement the circuit in the form of an integrated circuit.

SUMMARY OF THE INVENTION

An object of the present invention is to overcome these disadvantages by providing a stand-by device and a control circuit for a bias source, with low power consumption both during and outside bias source switching periods.

Another object of the present invention is to provide a bias source control circuit which allows setting the bias source at partial stand-by according to different modes of operation.

In order to achieve these objects, the present invention provides a stand-by control circuit for a ΔVbe/R bias source comprising mirror-connected bipolar transistors and using at least one stand-by control signal, including at least one partial stand-by device provided with means for virtually modifying, as a function of the state of the stand-by signal, the emitter surface area of at least one of said bipolar transistors, and at least one logic device receiving the stand-by control signal, comprising at least one first active load inverter controlled by the bias source, one output of this logic device controlling said means for virtually modifying the surface area of said at least one of said bipolar transistors.

According to an embodiment of the invention, the circuit comprises at least one control switch for at least one output stage of the bias source, said switch being controlled by an output of the logic device.

According to an embodiment of the invention, said means for virtually modifying the surface area include at least one bipolar transistor connected, through an n-channel MOS transistor controlled by the output of said logic device, in parallel with said at least one of said bipolar transistors.

According to an embodiment of the invention, the value of the standby current flowing in the bias source is adjusted by selecting the emitter surface area ratio of the two bipolar transistors connected in parallel and a transistor of another branch of the bias source.

According to an embodiment of the invention, said active load of said logic device comprises an n-channel MOS transistor connected as a current mirror with lower n-channel MOS transistors of the bias source; and said first inverter comprises at least one p-channel MOS transistor having a source, a gate and a drain which receives, at the gate, the stand-by signal, the drain being connected to a drain of said n-channel transistor which constitutes the active load, and the source being connected to a positive supply terminal.

According to an embodiment of the invention, at least one p-channel diode-connected MOS transistor is interposed between the positive supply terminal and the source of a p-channel MOS transistor which receives the stand-by signal at its gate.

According to an embodiment of the invention, the circuit comprises a start-up aid device, having an output connected to a control input of the bias source.

According to an embodiment of the invention, the start-up aid device includes a switch controlled by the bias source in order to deactivate the start-up aid device, outside the periods of application of a voltage to the circuit.

The use of a bipolar transistor, connected in parallel with one of the bipolar transistors of the bias source, enables the limitation of the current flowing in the bias source to a predetermined value. Moreover, this allows, at the time of manufacture of the stand-by device, an adjustment of this current as a function of the applications for which it is destined. Moreover, this device is independent of the bias source. Therefore, it will also be possible to construct a bias source having several stand-by current values, each corresponding to a stand-by setting of certain units activated by the bias source.

The fact that a logic device, equipped with an active load inverter controlled by the bias source itself, is used for the stand-by control signal, enables the power consumption of this inverter to be rendered independent both of the stand-by control signal switching time and of the potentials of its states.

The parity of the number of inverters included in the logic device depends on the signification of the states of the stand-by control signal from the point of view of the mode of operation of the bias source, active or at stand-by.

By disconnecting the bias source output stages, controlled by the logic device, particularly in the case where several partial stand-by states are required as a function of the different modes of operation, the units which must remain biased during a bias source partial stand-by can be selected.

The foregoing and other objects, features and advantages, of the present invention will be presented in detail in the following description of the non-limitative preferred embodiments when taken in conjunction with the accompanying drawings.

DETAILED DESCRIPTION

Figure 1:
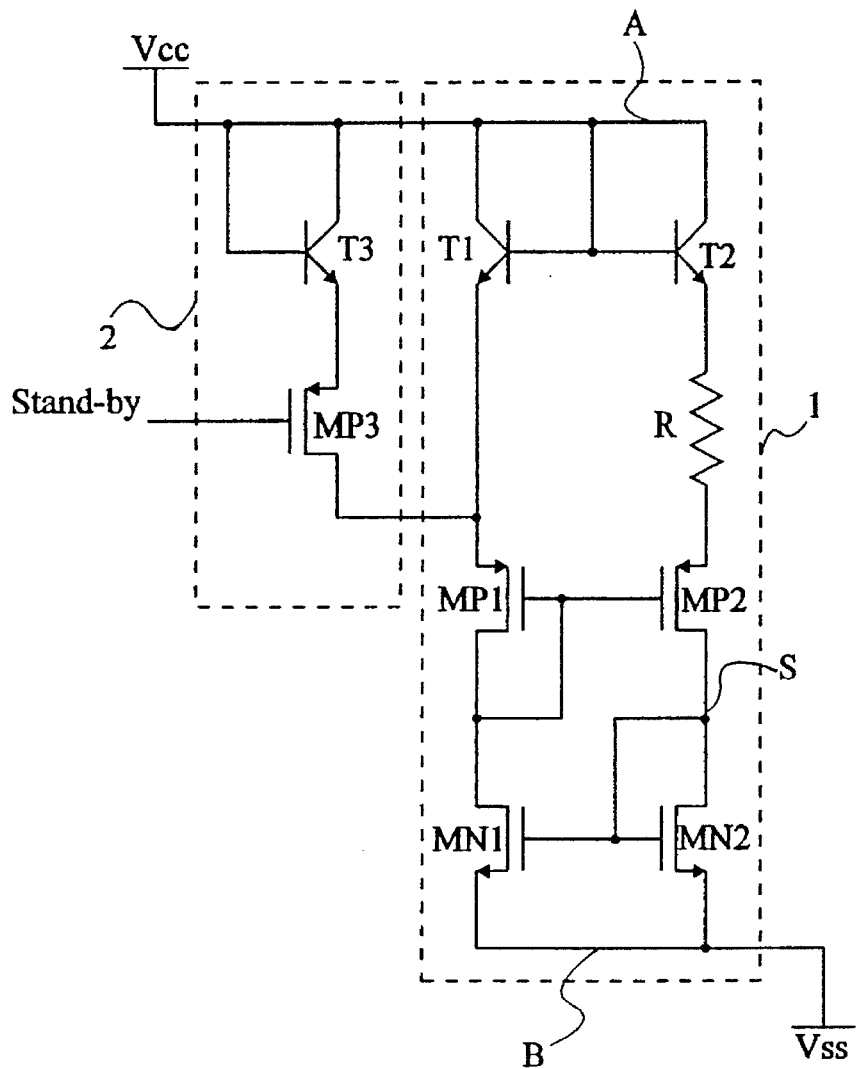
FIG. 1 is a schematic of an embodiment of a bias source partial stand-by device according to the invention.

As illustrated in FIG. 1, a $\Delta Vbe/R$ bias source 1 is, for example, constituted by a current mirror and a biasing resistor R. Two NPN type bipolar transistors T1, T2 have their collectors and their bases connected to a positive voltage supply terminal A at potential Vcc. The emitter of transistor T1 is connected to the source of a p-channel MOS transistor MP1. The emitter of transistor T2 is connected, through the biasing resistor R, to the source of a p-channel MOS transistor MP2. These two upper MOS transistors MP1, MP2 are connected as a current mirror and their gates are connected to the drain of transistor MP1. The drains of transistor MP1 and transistor MP2 are connected to the drains of n-channel MOS transistors MN1 and MN2 respectively, the sources of which are connected to a negative voltage supply terminal B at potential Vss.

The gates of the lower MOS transistors MN1, MN2, also connected as a current mirror, are connected together to the drain of transistor MN2 which constitutes an output terminal S of bias source 1. The role of such a bias source 1 is to activate the bias of one or several units of a circuit in which it is implanted, by reproducing the current which flows through it in a current source of the unit. This current source is for example constituted by a MOS transistor connected as a current mirror with the lower transistors MN1, MN2 of bias source 1.

A $\Delta Vbe/R$ bias source has two stable states. A first so-called active state corresponds to a state in which a current flows in each of the branches T1, MP1, MN1 and T2, R, MP2, MN2 of bias source 1. A second so-called inactive state corresponds to a state in which no current flows in the branches T1, MP1, MN1 and T2, R, MP2, MN2 of bias source 1. This bistable mode operation is due to the drain-source voltage drops of MOS transistors MP1, MN1, MP2, MN2 which block the bias source in its inactive state. In fact, these transistors are blocked as long as their gates are not brought, relatively to the potentials of their sources, to a predetermined potential which is less or greater than a value corresponding to the threshold voltage VT of the transistor for p-channel and n-channel transistors respectively. In the same way, once they are conductive, they will remain so as long as their gate potential does not reach this predetermined potential. Bias source 1 must therefore be able to be activated, or started up, upon the application of a voltage to the circuit. This initial activation is generally carried out by means of a start-up aid device 3 for which an embodiment will be presented below, in conjunction with FIG. 3.

When bias source 1 is activated, the current flowing in it is proportional to the difference between the base-emitter voltage drops of bipolar transistors T1, T2, and inversely proportional to biasing resistance R. In fact, when bias source 1 is active and balanced, i.e. when the currents flowing in each of its branches T1, MP1, MN1 and T2, R, MP2, MN2 are equal, current Ib in each of its branches is equal to $\Delta Vbe/R$. $\Delta Vbe$ denotes the difference $Vbe1-Vbe2$ between the base-emitter voltage drops of transistors T1, T2.

In order to set bias source 1 at partial stand-by, the invention proposes to reduce the current Ib flowing in its branches, i.e. the ratio $\Delta Vbe/R$.

A first solution includes increasing the value of biasing resistance R upon the occurrence of a stand-by signal. A second solution includes decreasing the value $\Delta Vbe$ upon the occurrence of a stand-by signal. The second solution is preferred because, as will be seen below, it can be implemented by means of transistors, which limits, in comparison with the use of a resistor, the surface area needed in an integrated circuit.

The partial stand-by device 2, such as is shown in FIG. 1 serves to modify, upon the occurrence of a stand-by signal, the difference between the base-emitter voltage drops Vbe of the bipolar transistors of the branches of bias source 1.

In order to do this, the partial stand-by device 2 comprises an NPN bipolar transistor T3 and a p-channel MOS transistor MP3. The collector and the base of transistor T3 are connected to voltage supply terminal A, while its emitter is connected to the source of transistor MP3. The gate of this transistor MP3 receives a logic "Stand-by" signal, while its drain is connected to the emitter of bipolar transistor T1 of bias source 1. Transistor T3 is thus connected in parallel with transistor T1, the parallel connection between these two transistors being controlled by transistor MP3. This transistor MP3 plays the role of a switch controlled by the stand-by control signal.

Thus, the fact that the base-emitter voltage drop Vbe of a bipolar transistor is proportional to the emitter surface area S of the transistor, is used to virtually modify the base-emitter voltage drop of the equivalent transistor of a branch of bias source 1. In fact the base-emitter voltage drop of a bipolar transistor is, to first approximation, equal to $kT/q*Ln(Ic/(S*Io))$, where k is Boltzmann's constant, q is the electron charge, T is the operating temperature, Ic is the transistor collector current, Io is the transistor saturation current and S is the transistor emitter surface area. The value $kT/q$ is constant for a given operating temperature. In this way, at a given temperature, the difference between the base-emitter voltage drops of transistors T1, T2 depends on the ratio of their emitter surface areas. In face $\Delta Vbe$ can be expressed in the form $\Delta Vbe=Vbe1-Vbe2=kT/q*\ln(S2/S1)$ where S1 and S2 denote the emitter surface areas of transistors T1 and T2 respectively.

Bias source 1 can thus be partially set at stand-by by means of a "Stand-by" signal. In the absence of a stand-by signal, MOS transistor MP3 is blocked and only transistor T1 participates in the production of the bias current Ib. It is supposed here that the logic "Stand-by" signal is at a high state in the absence of a stand-by, and is at a low state to command a partial stand-by of bias source 1. In the presence of a stand-by signal, MOS transistor MP3 conducts, causing transistors T1, T3 to be connected in parallel. In this way the first branch of bias source 1 corresponds to a bipolar transistor having a surface area equivalent to the sum of the emitter surface areas of transistors T1, T3. Hence the ratio of the emitter surface areas between the two branches of bias source 1 decreases, and consequently the current Ib flowing through bias source 1 decreases also.

It is to be noted that the value of this stand-by current is selectable at the time of construction of the circuit. In fact, the value of the stand-by current Is to flow in the branches of bias source 1 is determined by the value of the emitter surface area of transistor T3.

Figure 2:
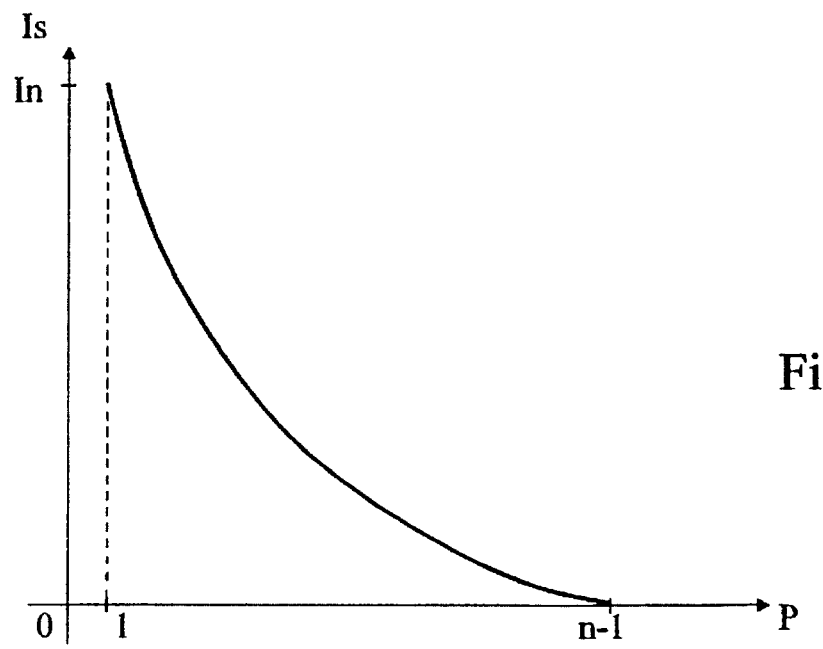
FIG. 2 is a graph showing the value of the current produced by the bias source as a function of the adjustment of the stand-by device shown in FIG. 1.

FIG. 2 shows the relationship between the value of the stand-by current Is in bias source 1 as a function of the emitter surface are of transistor T3. In order to establish this graph, it has been supposed that transistor T1 had an emitter surface area of one unit, and that transistor T1 had an emitter surface area of n units. The value of the emitter surface area of transistor T3 corresponds to p units.

It can be noticed that the current cancels when the emitter surface area of transistor T3 attains the value n−1 units. This value represents the extreme value which corresponds to rendering the sum of the emitter surface areas of transistors T1, T3 equal to the emitter surface area of transistor T2. In this case, $\Delta$Vbe cancels and bias source 1 is cut off. This threshold is however difficult to attain because of technological constraints in manufacturing. Additionally, this would pose a problem in restarting bias source 1, insofar as, as seen above, the active and inactive states of such a $\Delta$Vbe/R source are both stable states.

By way of example, such a device has been realised by means of transistors T1, T2, T3 with emitter surface area values of 1, 10, 8 respectively. For a supply voltage Vcc of 2.7 V and a biasing resistance R of 60 k$\Omega$, the normal $\Delta$Vbe, at the operating temperature of the device, is of 60 mV and the $\Delta$Vbe at stand-by is of 2.74 mV. Hence, the current Ib has a nominal value In of 1 µA and a stand-by value Is of 0.045 µA.

The above embodiment virtually increases the emitter surface area of the equivalent transistor of the first branch during stand-by periods. The same result can be obtained by virtually decreasing the emitter surface area of the equivalent transistor of the second branch during stand-by periods. In order to do this, the partial stand-by device is reproduced at transistor T2, and the stand-by control signal is inverted. Thus, in the absence of a stand-by setting, the virtual emitter surface area of the equivalent transistor of the second branch corresponds to the sum of the emitter surface area of transistor T2 and the emitter surface area of the parallel transistor. The appearance of a stand-by signal causes the suppression of the parallel connection of the transistor linked with transistor T2, which suppresses the contribution of its emitter surface.

It is also possible to combine these two solutions in order to have several current values during different stand-by periods, based on different stand-by control signals. Thus, the power consumed by a single bias source 1 can be fixed at more than two values as a function of the operation desired of the circuit in which it is implanted. This enables the optimisation of the independence of such a circuit if it is supplied by an independent power supply. The number of partial stand-by current values can be further multiplied by placing several bipolar transistors in parallel with one of transistors T1, T2. Each of these transistors is then controlled by a stand-by control signal associated with it, by means of a MOS transistor.

Figure 3:
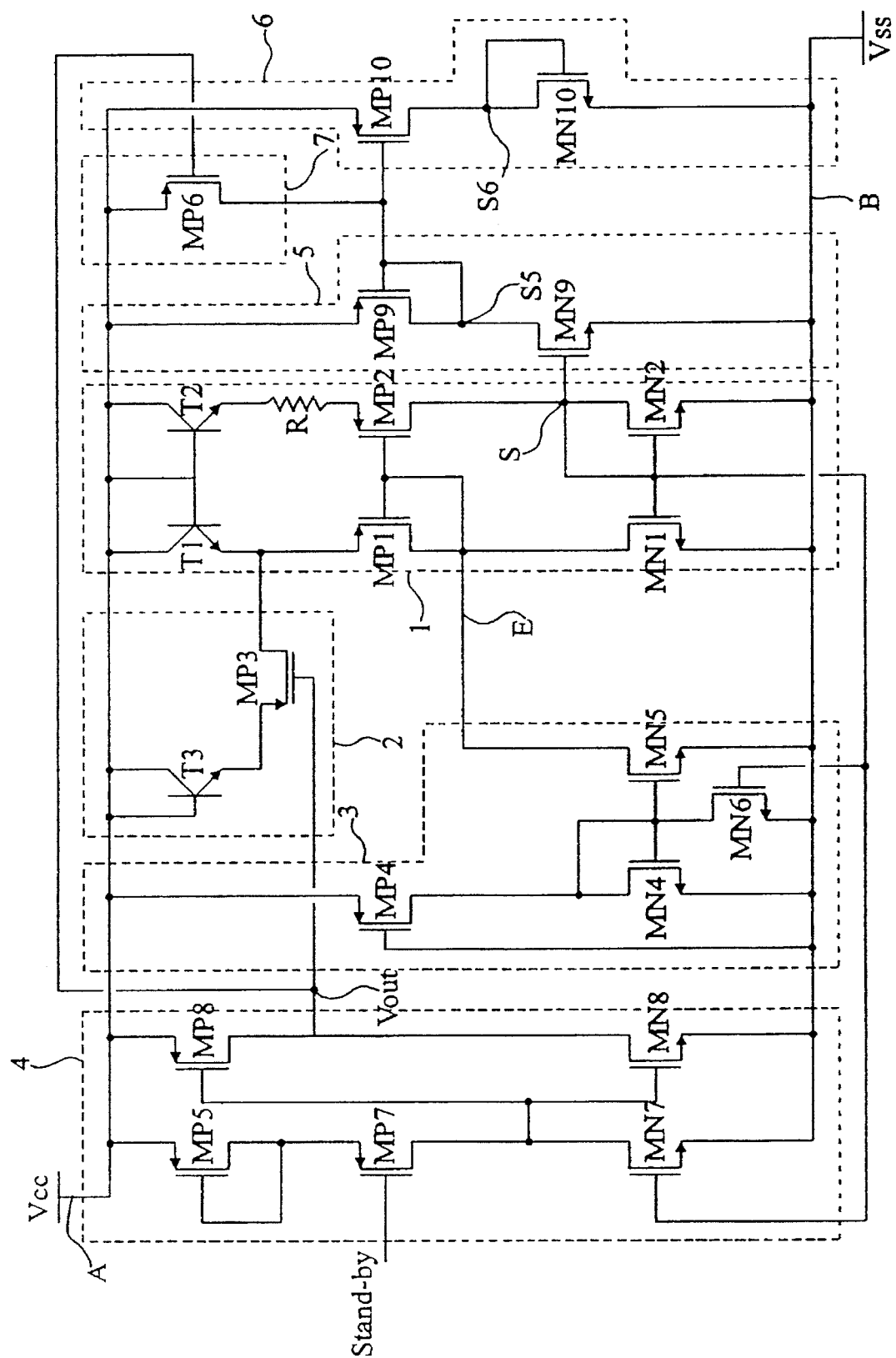
FIG. 3 is a schematic of an embodiment of a bias source control circuit, based on a stand-by device such as that shown in FIG. 1.

FIG. 3 shows a control circuit for setting to partial stand-by a bias source 1 which, associated with a partial stand-by device 2 such as that depicted in FIG. 1, enables to limit the power consumption of the control circuit.

As this schematic shows, the control circuit for bias source 1, according to the invention, essentially comprises three devices: a partial stand-by device 2 for bias source 1 using $\Delta$Vbe reduction, a start-up aid device 3 for the bias source 1, and an active load logic device 4.

Bias source 1 is supplied from two voltage supply terminals A, B at potentials Vcc, Vss respectively provided for example by a battery (not shown). A "Stand-by" signal is received by the control circuit. The "Stand-by" signal is sent to logic device 4 which serves to have an abrupt switching of stand-by device 2 upon the appearance of a change in the state of the "Stand-by" signal.

Bias source 1 is identical to that shown in FIG. 1. Its components have been designated by the same references. An output S of bias source 1 is sent, via a device 5 (commonly called a transmission belt), to an output stage 6 which constitutes a bias stage of a unit (not shown) to be biased.

This bias source 1 has a control input E constituted by the drains of transistors MP1, MN1, which are connected to an output of start-up aid device 3.

Start-up aid device 3 is comprised of four MOS transistors MP4, MN4, MN5, MN6. The source of p-channel MOS transistor MP4 is connected to voltage supply terminal B. The drain of this transistor MP4 is connected to the drain of n-channel MOS transistor MN4, diode-connected with its gate connected to its drain. The source of transistor MN4 is connected to terminal B. The drains of transistors MP4, MN4 are also connected to the gate of n-channel MOS transistor MN5 whose source is connected to terminal B. In other words, this transistor MN5 and transistor MN4 are connected as a current mirror. The drain of transistor MN5, which constitutes the output of start-up aid device 3 is connected to the drains of transistors MP1, MN1, which constitute the control input E of bias source 1.

The gates of transistors MN4, MN5 are also connected to the drain of n-channel transistor MN6. The source of this transistor MN6 is connected to the output B and its gate is connected to the output S of bias source 1. In other words this transistor MN6 is connected as a current mirror with the lower MOS transistors MN1, MN2 of bias source 1.

The role of start-up aid device 3 is, at the time of the application of a voltage to the circuit, to ensure that bias source 1 passes from its inactive state to its active state.

In fact, upon the application of a voltage to the circuit, transistor MP4 conducts insofar as its gate-source voltage drop is equal to Vcc−Vss. The gate potentials of transistors MN4, MN5 are therefore at a potential Vcc, decreased by the voltage drop in the series resistor of transistor MP4. As the sources of the two transistors MN4, MN5 are at a potential Vss, these transistors MN4, MN5 also conduct. Transistor MN5 then biases the gates of transistors MP1, MP2 with a potential Vss, less the voltage drop in the series resistor of transistor MN5. Thus these transistors MP1, MP2 begin to conduct, and through the connection between the gates of transistors MN1, MN2 and the drain of transistor MP2, transistors MN1, MN2 also turn on. Bias source 1 is then in its active stable state.

In contrast, the currents flowing in transistors MN1, MN2 are unbalanced because of the conduction of transistor MN5. However, when bias source 1 has started up, transistor MN6 begins to conduct insofar as it is connected as a current mirror with transistors MN1, MN2. This initiates the blocking of transistor MN5, which then draws no more current from bias source 1, which facilitates a balancing of the currents flowing in its branches. Transistor MN6 plays the role of a switch controlled by bias source 1 in order to deactivate the start-up aid device, outside the periods during which a voltage is applied to the circuit.

Start-up aid device 3 is of use only at the time of the application of a voltage to the circuit. It is subsequently of no use. For this reason attention will be paid to ensuring that the series resistance of transistor MP4 is sufficiently high to limit the current consumption of this device. In other words, transistor MP4 has a high W/L ratio, i.e. a large gate width with respect to its gate length.

Logic device 4 is constituted by two inverters based on MOS transistors. A first inverter of this logic device 4 comprises three MOS transistors MP5, MP7, MN7, with n-channel MOS transistor MN7 representing an active load controlled by bias source 1. Transistor MP5 is diode-connected in order to reduce the trigger threshold of this inverter to the value Vcc−2*Vgsp, where Vgsp denotes the gate-source threshold voltage of p-channel MOS transistors MP5, MP7. The source of p-channel MOS transistor MP5 is connected to terminal A while its gate is connected to its drain which is in turn connected to the source of p-channel MOS transistor MP7. The gate of transistor MP7 receives the "Stand-by" signal, while its drain is connected to the drain of transistor MN7. The source of transistor MN7 is connected to voltage supply terminal B whereas its gate is connected to output S of bias source 1. In other words transistor MN7 is connected as a current mirror with the lower transistors MN1, MN2 of bias source 1. The drains of transistors MP7, MN7 constitute the output of the first inverter of logic device 4 which is sent to a second inverter based on MOS transistors.

This second inverter is a conventional CMOS inverter. It comprises two MOS transistors MP8, MN8 whose gates are both connected to the drains of transistors MP7, MN7. The source of p-channel MOS transistor MP8 is connected to voltage supply terminal A, while its drain is connected to the drain of n-channel transistor MN8. The source of transistor MN8 is connected to voltage supply terminal B. The drains of the two transistors MP8, MN8 constitute the output Vout of this second inverter and of logic device 4.

Logic device 4 has a dual role. On the one hand, it accelerates, by the geometry of its transistors, the switching time of the stand-by device. On the other hand, it transforms the low state of the stand-by signal, which is used to switch stand-by device 2, into a logic signal from the viewpoint of the latter. In fact, even though the stand-by signal is itself a logic signal, it often happens that its levels do not correspond to the potentials Vcc and Vss of the voltage supply of bias source 1, but that they are at intermediate potentials V+ and V−.

The role of the active load of the first inverter is to limit the consumption of logic device 4, outside of the switching periods of bias source 1 between its nominal state of operation and its stand-by state.

The output Vout of logic device 4 constitutes the partial stand-by control signal for bias source 1. This output is therefore connected to the gate of p-channel MOS transistor MP3 of stand-by device 2. This stand-by device 2 is constituted, as in FIG. 1, by an NPN type bipolar transistor T3 connected in parallel with transistor T1 of bias source 1, via transistor MP3.

The output Vout of logic device 4 is also sent to the control of a switch 7 constituted by a p-channel MOS transistor MP6. The role of this switch 7 is to deactivate the output stage 6 of bias source 1 during the stand-by periods of the latter. In the embodiment shown, this switch 7 deactivates output stage 6 and hence the unit (not shown) which it is to bias.

Device 5 (commonly called the "Transmission belt") is constituted by two MOS transistors MP9, MN9. P-channel MOS transistor MP9 is connected by its source to voltage supply terminal A. Its drain, which constitutes output S5 of this device 5, is connected to its own gate and to the drain of n-channel transistor MN9. The source of this transistor MN9 is connected to voltage supply terminal B. The gate of this transistor MN9, which constitutes the input of this device 5, is connected to output S of bias source 1. In other words, this transistor MN9 is connected as a current mirror with lower transistors MN1, MN2 of bias source 1.

Output stage 6 is constituted by two MOS transistors MP10, MN10. P-channel MOS transistor MP10 is connected by its source to voltage supply terminal A, while its drain is connected to the drain of diode-connected n-channel transistor MN10. The source of this transistor MN10 is connected to voltage supply terminal B while its drain, connected to its own gate, constitutes this stage 6 output S6. The input of this stage 6 is constituted by the gate of transistor MP9 of device 5. In other words, transistor MP10 is connected as a current mirror with transistor MP9.

Switch 7, constituted by transistor MP6, has the purpose of controlling the current mirror between transistors MP9, MP10. Its source is connected to voltage supply terminal A while its drain is connected to the gates of transistors MP9, MP10. The gate of this transistor MP6 receives the output signal Vout of logic device 4 as a control signal. Hence, when transistor MP6 conducts, the gates of transistors MP9, MP10 are at potential Vcc of terminal A, minus the voltage drop in the series resistor of transistor MP6. Consequently, transistors MP9, MP10 are blocked and output stage 6 is deactivated. When transistor MP6 is blocked, the two transistors MP9, MP10 turn on and output stage 6 can bring a current to the unit whose bias it is to activate.

Other output stages, similar to stage 6, can easily be linked to bias source 1. In order to do this, for example, the arrangement of transistors MP10, MN10 can be reproduced, by means of one p-channel MOS transistor and one n-channel MOS transistor per output stage. The gate of the p-channel transistor of each stage is connected to the gate of transistor MP9, in such a way that all of the output stages operate in the same manner as stage 6. The output of each stage is constituted by the drains of its transistors.

According to the invention, the control circuit limits the consumption of its devices outside their periods of useful operation. This circuit enables in particular the current consumption of logic device 4 to be limited, during the stand-by of bias source 1, by means of the active load MN7 controlled by bias source 1.

Figure 4A:
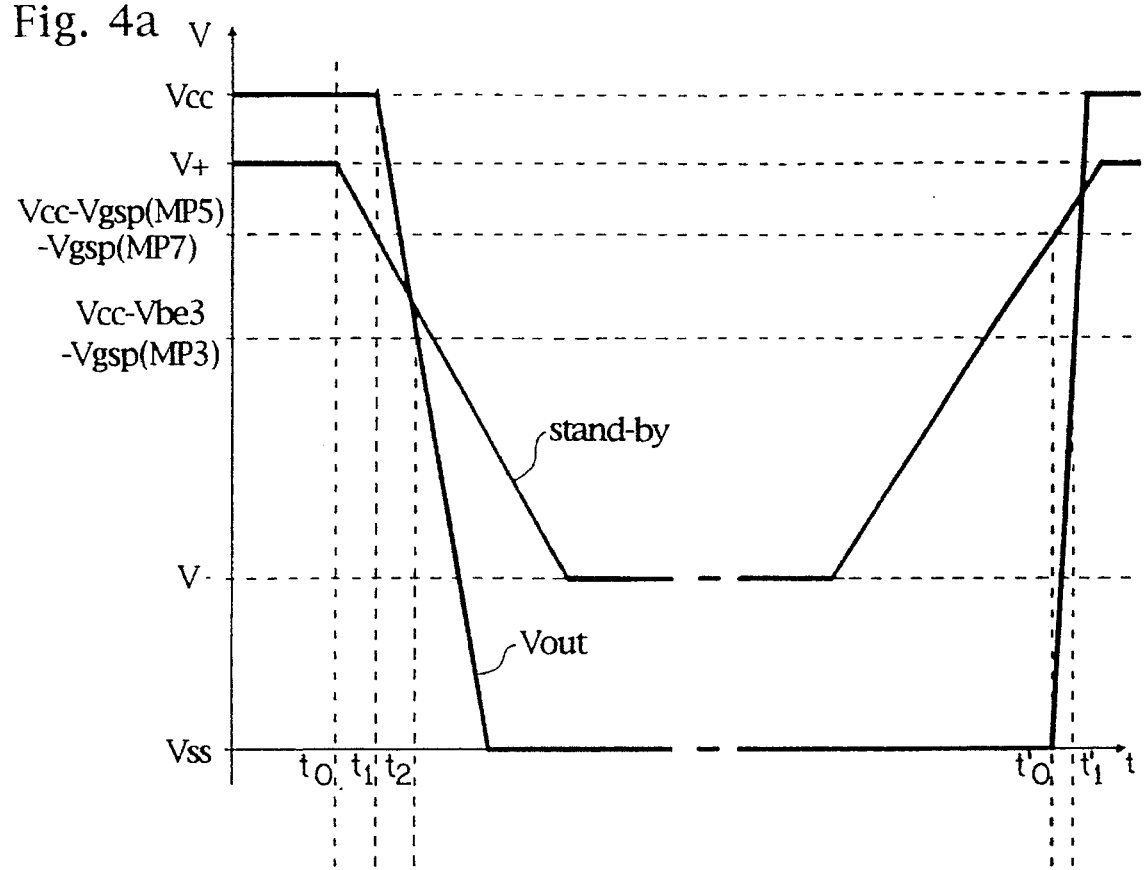
FIG. 4 is a time diagram of the most significant voltages and currents of the control circuit shown in FIG. 3 during a switching of the stand-by device.
Figure 4B:
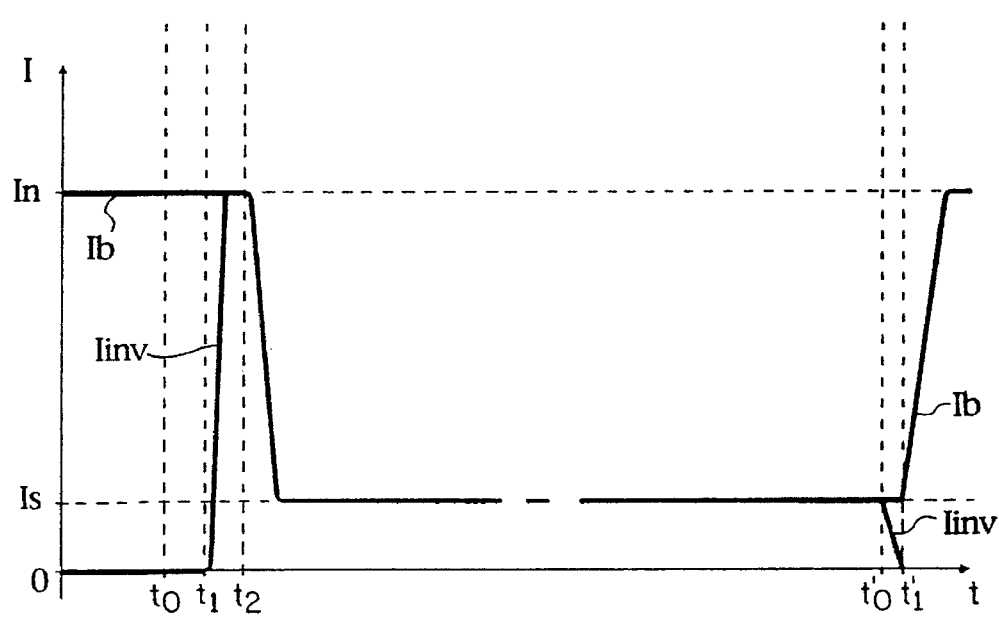

This operation is illustrated by FIG. 4, which shows, in the form of time diagrams, the potential of the "Stand-by"

signal and of the output Vout of logic device 4 and the currents Iinv, Ib, flowing in transistor MN7 and in bias source 1, respectively.

In the absence of a stand-by control at the input of the control circuit, it is supposed that the "Stand-by"signal is at a high state corresponding to the potential V+. Bias source 1 is in its active state, and transistors MP1, MP2, MN1, MN2 all conduct.

No current flows in logic device 4, insofar as the stand-by signal is in its high state V+, transistor MP7 is therefore blocked. It is supposed for this that the value of the potential V+ is greater than Vcc–Vgsp(MP5)–Vgsp(MP7) which is the trigger threshold of transistor MP7, with Vgsp(MP5) denoting the gate-source threshold voltage of transistor MP5 and Vgsp(MP7) denoting the gate-source threshold voltage of transistor MP7.

It this is not the case it is necessary to further reduce the trigger threshold of transistor MP7 in order to enable the stand-by setting to function. One means for reducing the trigger threshold of transistor MP7 consists in adding one or several additional diode-connected transistors, between supply terminal A and the source of transistor MP5.

At time t0, the "Stand-by" signal starts a transition towards its low state. As long as the "Stand-by" signal has not attained the value Vcc–Vgsp(MP5)–Vgsp(MP7), the output Vout of logic device 4 remains at the value Vcc, minus the voltage drop across the series resistor of transistor MP8. The current Ib in bias source 1 is at its nominal value In, fixed by the geometry of transistors T1, T2. As the active load inverter has not yet switched, no current Iinv flows in transistor MN7.

From time t1, where the "Stand-by" signal attains the value Vcc–Vgsp(MP5)–Vgsp(MP7), transistor MP7 turns on. The current Iinv in transistor MN7 then has a peak in order to meet the current Ib with which it is mirrored.

As soon as the potential Vout at the output of logic device 4 attains the value Vcc–Vgsp(MP6), transistor MP6 turns on. Thus output stage 6 of bias source 1 is deactivated. This deactivation of output stage 6 occurs almost exactly at time t1, insofar as voltage Vout has a steep edge. In the case where several output stages are linked to transmission device 5 and switch 7, all of these stages are deactivated.

At time t2, where the signal Vout attains the value Vcc–Vbe3–Vgsp(MP3), transistor MP3 begins to conduct and the stand-by setting is triggered. The current Ib then drops to the value Is, fixed by the geometry of transistors T1, T2, T3, and bias source 1 is at stand-by.

As transistor MN7 which constitutes the active load of logic device 4 is connected as a current mirror with transistors MN1, MN2, the current Iinv flowing in this transistor MN7 is limited to the value of the stand-by current of bias source 1. It is even possible to seek to further reduce this value by reducing the W/L ratio of transistor MN7 with respect to the W/L ratio of transistor MN2.

Thus the current consumption of logic device 4 is reduced as soon as bias source 1 is at stand-by. The power consumption of logic device 4 is limited to a predetermined value, no matter how long the transition of the "Stand-by" signal between its two states lasts. This is not the case in a conventional inverter, where the current in the inverter is linked to the potential of the "Stand-by" signal. In fact, this current is fixed by the relationship between the "Stand-by" signal potential and the series resistor of the MOS transistors constituting the inverter.

Moreover, this residual consumption is independent of the levels of the "Stand-by" signal. Hence the current Iinv in the active load inverter is limited to the same value, even if the potentials V+, V− of the low and high states of the "Stand-by" signal differ from the supply terminal potentials A and B. This is not the case in previous devices of the art, where the residual consumption during the stand-by periods of the bias source increases with the difference between potential V− and potential Vss.

When the "Stand-by" signal starts a transition towards its high state, indicating a request to return to the nominal operation of bias source 1, the inverse switching happens at the same triggering thresholds.

Hence, at time t'0, where the potential of the "Stand-by" signal attains the threshold value Vcc–Vgsp(MP5)–Vgsp(MP7), transistors MP5 and MP7 are blocked. This causes the signal Vout to increase once more, under the influence of transistor MN7 and the second inverter constituted by transistors MP8 and MN8. The current Iinv cancels. At time t'1, where the signal Vout attains the value Vcc–Vbe3–Vgsp(MP3), transistor MP3 blocks, and consequently transistor T3 also blocks. The current Ib in bias source 1 is then once more at the nominal value In. The output Vout is once more at potential Vcc, less the voltage drop in the series resistor of transistor MP8.

As soon as the output potential Vout of logic device 4 attains the value Vcc–Vgsp(MP6), output stage 6 of bias source 1 is activated again. As when setting at stand-by, this activation is immediate.

The representation in FIG. 4 is not to scale for reasons of clarity. In particular, the difference between the values of potentials Vcc–Vgsp(MP5)–Vgsp(MP7) and Vcc–Vbe3–Vgsp(MP3) is in reality very small, or even inverted, in comparison with this representation. Since the output potential Vout of logic device 4 has the value Vcc, less the voltage drop in the series resistor of transistor MP8, as soon as the "Stand-by" signal attains value Vcc–2*Vgsp, the switching of transistors MP3 and MP6 is simultaneous in this case.

For the requirements of the present description, the gate-source voltage drops of the MOS transistors have been individually designated. In practice, since these transistors are constructed on the same chip, transistors of the same type (n-channel, p-channel) will have approximately the same gate-source threshold voltage.

Although not shown in the drawings, it is possible, by means of the invention, to construct a bias source which has several different stand-by current values Is. This is so when the system in which the bias source is implanted can have several different stand-by modes. In this case as many stand-by devices 2 and logic devices 4 as modes of operation are provided. In addition provision is made for the control, by the outputs of the logic devices, of the different output stages for activating the bias of the different units of the system.

In order to do this, for example, switch 7 can be deleted, and for each output stage associated to transmission device 5 use can be made of a second n-channel MOS transistor whose source is connected to supply terminal B, and whose drain is connected to the drain of the first n-channel MOS transistor of the stage in question. The gate of this second n-channel transistor can then be controlled, for example, by the inverse of the logic device output connected to this stage, in order to place the stage output at potential Vss, during the required stand-by periods of the stage in question. These second n-channel MOS transistors then play the role of switches controlled by the logic device to which they are linked.

Also, several transmission devices 5 could be provided, each linked to a switch 7 controlled by a logic device and to one or more output stages 6.

Having thus described at least one illustrative embodiment of the invention, various alterations, modifications and improvements will readily occur to those skilled in the art. Such alterations, modifications and improvements are intended to be part of this disclosure, and are intended to be within the spirit and scope of the invention. In particular, the choice of the width to length ratios of the transistor gates is a function of the use for which the bias source is destined. Along the same lines, it is possible to replace each of the described components by one or several elements fulfilling the same function. Accordingly, the foregoing description is by way of example only and is not intended to be limiting. The invention is limited only as defined in the following claims and equivalents thereto.

What is claimed is:

1. A stand-by control circuit, for a $\Delta$Vbe/R bias source including two bipolar transistors each defining a branch of the bias source and, in each branch, an upper p-channel and a lower n-channel MOS transistor serial connected with the bipolar transistor of the branch, the stand-by control circuit comprising:

a partial stand-by device to connect an additional bipolar transistor in parallel to one of the two bias source bipolar transistors; and a logic device to receive a two-state stand-by control signal including an active load inverter which includes an n-channel MOS transistor constituting an active load having a gate and a source respectively connected to gates and sources of the bias source lower n-channel MOS transistors whereby the bias source controls the active load, and an output of the logic device controlling, as a function of the stand-by control signal state, the parallel connection of the partial stand-by device additional bipolar transistor.

2. The circuit of claim 1, further comprising:

a control switch coupled to the logic device;

an output stage coupled to the bias source and to the control switch;

wherein the control switch receives said logic device output to deactivate the output stage.

3. The circuit of claim 1, wherein said partial stand-by device further comprises a p-channel MOS transistor controlled by said logic device output and connected between an emitter of said additional bipolar transistor and an emitter of said one of said bias source bipolar transistors.

4. The circuit of claim 3, wherein a value of stand-by current flowing in the bias source is proportional to a ratio of the sum of emitter surface areas of said partial stand-by device additional bipolar transistor and of said one of the bias source bipolar transistors to an emitter surface area of the other of the two bias source bipolar transistors.

5. The circuit of claim 1, wherein said active load inverter comprises a p-channel MOS transistor having a source, a gate and a drain, said gate to receive said stand-by signal, said drain being connected to a drain of said n-channel MOS transistor which constitutes the active load, and said source being connected to a positive supply terminal.

6. The circuit of claim 5, wherein a p-channel diode-connected MOS transistor is coupled between the positive supply terminal and the source of said p-channel MOS transistor which receives the stand-by signal.

7. The circuit of claim 1, further comprising a start-up aid device, an output of said start-up aid device being connected to a control input of the bias source.

8. The circuit of claim 7, wherein said start-up aid device includes an n-channel MOS transistor having a gate and a source respectively connected to said gates and said sources of said bias source lower n-channel transistors to form a switch controlled by the bias source in order to deactivate the start-up aid device once the bias source has started operation.

9. A stand-by control circuit for controlling a $\Delta$Vbe/R bias current source including first and second bias branches, the first bias branch including a first bipolar transistor having a first emitter surface area and the second bias branch including a second bipolar transistor having a second emitter surface area, the stand-by control circuit comprising:

a third bipolar transistor having a third emitter surface area; and a partial stand-by circuit to connect the third bipolar transistor in parallel with the first bipolar transistor;

wherein, when the third bipolar transistor is connected in parallel with the first bipolar transistor, a bias current in the bias current source is reduced.

10. The stand-by control circuit as recited in claim 9, wherein the partial stand-by circuit comprises:

a MOS transistor to connect the third bipolar transistor in parallel with the first bipolar transistor.

11. The bias current source as recited in claim 9, wherein the stand-by circuit comprises:

a MOS transistor, connected to the third bipolar transistor and the first bipolar transistor, having a gate to receive a stand-by control signal.

12. The bias current source as recited in claim 11, further comprising:

an active load logic circuit to provide the stand-by control signal to the stand-by circuit.

13. The bias current source as recited in claim 12, wherein the active load logic circuit comprises:

a first inverter circuit having a first inverter output; and a second inverter circuit to receive the first inverter output and provide a second inverter output as the stand-by control signal.

14. A bias current source for providing a bias current, comprising:

a $\Delta$Vbe/R bias current circuit having a first bipolar transistor in a first branch and a second bipolar transistor in a second branch;

a stand-by circuit, coupled to the $\Delta$Vbe/R bias current circuit, to reduce the bias current in the bias current source;

an active load logic circuit to provide the stand-by control signal to the stand-by circuit, the logic circuit comprising a first inverter circuit having a first inverter output and a second inverter circuit to receive the first inverter output and provide a second inverter output as the stand-by control signal; wherein the $\Delta$Vbe/R bias current circuit includes first and second MOS transistors connected together as a current mirror with a gate of the first MOS transistor connected to a gate of the second MOS transistor; and the first inverter circuit includes a third MOS transistor having a gate connected to the gate of the second MOS transistor whereby current consumption in the active load logic circuit is reduced in response to the state of the stand-by control signal.

15. The bias current source as recited in claim 12, further comprising:

an output stage coupled to the $\Delta$Vbe/R bias current circuit; and a switch coupled to the output stage and the active load logic circuit, wherein the switch deactivates the output stage in response to the state of the stand-by control signal.

16. The bias current source as recited in claim 9, further comprising:

a start-up aid circuit coupled to the ΔVbe/R bias current source to activate the ΔVbe/R bias current source at a time of an application of a supply voltage to the bias current source.

17. A method of setting a bias current source to a stand-by current level, the bias current source including a ΔVbe/R bias current source having first and second bipolar transistors in first and second branches, respectively, the first and second bipolar transistors having first and second emitter surface areas, respectively, the method comprising the steps of:

conducting current in the first and second bipolar transistors at a bias current level; and connecting, through a partial stand-by circuit and in response to a first transition of a stand-by control signal from a first state to a second state, a third bipolar transistor having a third emitter surface area in parallel with the first bipolar transistor to reduce the bias current of the first and second bipolar transistors thereby changing the current in the ΔVbe/R bias current source to the stand-by bias current level.

18. The method as recited in claim 17, further comprising the step of:

defining the stand-by current level by providing the third bipolar transistor having a third emitter surface area wherein the stand-by current level is proportional to a ratio of the sum of a first emitter surface area of the first bipolar transistor and the third emitter surface area to a second emitter surface area of the second bipolar transistor.

19. The method as recited in claim 17, further comprising the steps of:

inverting the stand-by control signal before the step of changing responds to the stand-by signal; and limiting the power consumed in the inverting step as a function of the stand-by current level.

20. The method as recited in claim 17, further comprising the step of:

changing, by the partial stand-by circuit, the current in the ΔVbe/R bias current source to the first bias current level by disconnecting the third bipolar transistor from the first bipolar transistor in response to a second transition of the stand-by control signal from the second state to the first state.

* * * * *